US 9,705,532 B2

(12) United States Patent
Kharkunou

(10) Patent No.: US 9,705,532 B2
(45) Date of Patent: Jul. 11, 2017

(54) PARALLEL LOW-DENSITY PARITY CHECK (LDPC) ACCUMULATION

(71) Applicant: ARRIS Group, Inc., Suwanee, GA (US)

(72) Inventor: Yury Kharkunou, Cobh (IE)

(73) Assignee: ARRIS Enterprises LLC, Suwanee, GA (US)

( * ) Notice: Subject to any disclaimer, the term of this patent is extended or adjusted under 35 U.S.C. 154(b) by 105 days.

(21) Appl. No.: 14/207,459

(22) Filed: Mar. 12, 2014

(65) Prior Publication Data

US 2014/0281797 A1   Sep. 18, 2014

Related U.S. Application Data

(60) Provisional application No. 61/790,171, filed on Mar. 15, 2013.

(51) Int. Cl.
| | | |
|---|---|---|
| *G06F 11/10* | (2006.01) | |
| *G06F 11/00* | (2006.01) | |
| *H03M 13/00* | (2006.01) | |
| *H03M 13/11* | (2006.01) | |
| *H04L 1/00* | (2006.01) | |

(52) U.S. Cl.
CPC ... *H03M 13/6561* (2013.01); *H03M 13/1165* (2013.01); *H03M 13/611* (2013.01); *H03M 13/6505* (2013.01); *H04L 1/0057* (2013.01)

(58) Field of Classification Search
None
See application file for complete search history.

(56) References Cited

U.S. PATENT DOCUMENTS

| | | | | |
|---|---|---|---|---|
| 6,957,375 | B2 * | 10/2005 | Richardson | H03M 13/1137 714/752 |
| 7,346,832 | B2 * | 3/2008 | Richardson | H03M 13/611 714/758 |
| 7,403,547 | B2 | 7/2008 | Downey et al. | |
| 7,873,077 | B2 | 1/2011 | Downey et al. | |
| 8,028,216 | B1 * | 9/2011 | Yeo | H03M 5/145 714/755 |
| 8,145,972 | B2 * | 3/2012 | Kim | H03M 13/1102 714/752 |

(Continued)

OTHER PUBLICATIONS

Internet Archive WayBack Machine, Chapter 7 Non-Contiguous Memory Allocation, Oct. 2008, https://web.archive.org/web/20081010002633/http://www.kernel.org/doc/gorman/html/understand/understand010.html.*

(Continued)

*Primary Examiner* — Justin R Knapp
(74) *Attorney, Agent, or Firm* — Stewart M. Wiener

(57) ABSTRACT

Systems and methods for parallel accumulation of information bits as part of the generation of low-density parity-check codes are provided. Consecutive information bits can be accumulated through vector operations where the parity addresses used for accumulation can be made contiguous through a virtual to private parity address map. The method for accumulating a set of parity bits for an encoding operation may comprise the steps of performing an exclusive or (XOR) between a multi-bit vector containing information bits and a multi-bit vector of parity bits in an encoder, and storing results of the XOR as a set of parity bits. An encoder for accumulating the set of parity bits is also provided.

14 Claims, 5 Drawing Sheets

(56) References Cited

U.S. PATENT DOCUMENTS

| | | | |
|---|---|---|---|
| 8,352,847 B2* | 1/2013 | Gunnam | G06F 17/16 714/758 |
| 8,539,304 B1* | 9/2013 | Shirali | H03M 13/116 714/758 |
| 2010/0017578 A1* | 1/2010 | Mansson | G06F 12/023 711/171 |

OTHER PUBLICATIONS

"Digital Video Broadcasting (DVB); Frame structure channel coding and modulation for a second generation digital transmission system for cable systems (DVB-C2)", European Standard, ETSI EN 302 769 V1.2.1, Apr. 2011.

* cited by examiner

| VPA | PPA | VPA Group |
|---|---|---|
| 16199 | 16199 | |
| ⋮ | ⋮ | 44 |
| 15841 | 99 | |
| 15840 | 44 | |
| ⋮ | ⋮ | ⋮ |
| 719 | 16156 | |
| ⋮ | ⋮ | 1 |
| 361 | 46 | |
| 360 | 1 | |
| 359 | 16155 | |
| ⋮ | ⋮ | |
| 2 | 90 | 0 |
| 1 | 45 | |
| 0 | 0 | |

FIG. 2

Parity Bit Addresses in RAM

Normal FECFrame, Code Rate = 3/4

500

510

520

| | | | | | | | | | | | | |
|---|---|---|---|---|---|---|---|---|---|---|---|---|
| Row 1 | 0 | 6385 | 7901 | 14611 | 13389 | 11200 | 3252 | 5243 | 2504 | 2722 | 821 | 7374 |
| Row 2 | 1 | 11359 | 2698 | 357 | 13824 | 12772 | 7244 | 6752 | 15310 | 852 | 2001 | 11417 |
| Row 3 | 2 | 7862 | 7977 | 6321 | 13612 | 12197 | 14449 | 15137 | 13860 | 1708 | 6399 | 13444 |
| Row 4 | 3 | 1560 | 11804 | 6975 | 13292 | 3646 | 3812 | 8772 | 7306 | 5795 | 14327 | 7866 |
| Row 5 | 4 | 7626 | 11407 | 14599 | 9689 | 1628 | 2113 | 10809 | 9283 | 1230 | 15241 | 4870 |
| Row 6 | 5 | 1610 | 5699 | 15876 | 9446 | 12515 | 1400 | 6303 | 5411 | 14181 | 13925 | 7358 |
| Row 7 | 6 | 4059 | 8836 | 3405 | 7853 | 7992 | 15336 | 5970 | 10368 | 10278 | 9675 | 4651 |
| Row 8 | 7 | 4441 | 3963 | 9153 | 2109 | 12683 | 7459 | 12030 | 12221 | 629 | 15212 | 406 |
| Row 9 | 8 | 6007 | 8411 | 5771 | 3497 | 543 | 14202 | 875 | 9186 | 6235 | 13908 | 3563 |
| Row 10 | 9 | 3232 | 6625 | 4795 | 546 | 9781 | 2071 | 7312 | 3399 | 7250 | 4932 | 12652 |
| Row 11 | 10 | 8820 | 10088 | 11090 | 7069 | 6585 | 13134 | 10158 | 7183 | 488 | 7455 | 9238 |
| Row 12 | 11 | 1903 | 10818 | 119 | 215 | 7558 | 11046 | 10615 | 11545 | 14784 | 7961 | 15619 |
| Row 13 | 12 | 3655 | 8736 | 4917 | 15874 | 5129 | 2134 | 15944 | 14768 | 7150 | 2692 | 1469 |
| Row 14 | 13 | 8316 | 3820 | 505 | 8923 | 6757 | 806 | 7957 | 4216 | 15589 | 13244 | 2622 |
| Row 15 | 14 | 14463 | 4850 | 15733 | 3041 | 11193 | 12860 | 13673 | 8152 | 6551 | 15108 | 8758 |
| Row 16 | 15 | 3159 | 11981 | | | | | | | | | |
| Row 17 | 16 | 13416 | 6906 | | | | | | | | | |
| Row 18 | 17 | 2009 | 14460 | | | | | | | | | |
| Row 19 | 18 | 7207 | 4314 | | | | | | | | | |
| Row 20 | 19 | 3312 | 3945 | | | | | | | | | |
| Row 21 | 20 | 4418 | 6248 | | | | | | | | | |
| Row 22 | 21 | 2669 | 13975 | | | | | | | | | |

⋮

| | | | |
|---|---|---|---|
| Row 130 | 39 | 8101 | 10187 |
| Row 131 | 40 | 11963 | 4848 |
| Row 132 | 41 | 15125 | 6119 |
| Row 133 | 42 | 8051 | 14465 |
| Row 134 | 43 | 11139 | 5167 |
| Row 135 | 44 | 2883 | 14521 |

FIG. 5

PARALLEL LOW-DENSITY PARITY CHECK (LDPC) ACCUMULATION

CROSS REFERENCE TO RELATED APPLICATIONS

This application claims the benefit under 35 USC §119(e) of U.S. Provisional Patent Application No. 61/790,171, filed Mar. 15, 2013.

BACKGROUND

This disclosure relates to encoding information with low-density parity-check (LDPC) codes providing forward error correction (FEC) for information transmission in communication systems.

Communication systems can transmit information over a wired and/or wireless transmission media. The transmission media can be subject to noise, interference and distortion that can introduce errors in the transmission of information. Communication systems can use protocols including error detecting algorithms (e.g., cyclic redundancy check) to determine if the received information can be in error. Communications systems can also include protocols with retry mechanisms wherein the information received with errors can be re-transmitted.

A bit error rate (BER) represents one measurement of the transmission characteristics of communication systems. The BER can be represented by the ratio of the number of bit errors over the number of bits transmitted over a time period. Reduction of the BER can increase the bandwidth for the transmission of communication information through minimizing communication information retries and enabling higher bandwidth modulation formats.

A forward error correction (FEC) algorithm can use error correcting codes that can be transmitted with communication information and can enable one or more receivers to reconstruct the communication information with errors introduced during transmission. In some implementations, a low-density parity check (LDPC) linear error correction code can be used as the FEC algorithm in communication systems. For example, the "Digital Video Broadcasting (DVB); Frame structure channel coding and modulation for a second generation digital transmission system for cable systems (DVB-C2)", ETSI EN 302 769 V1.2.1, 2011-04, (hereafter "ETSI DVB") standard, incorporated herein in its entirety, specifies a FEC subsystem including LDPC.

BRIEF DESCRIPTION OF THE DRAWINGS

FIG. 2 is a table illustrating an example virtual to physical parity address map operable to accumulate a set of consecutive information bits.

FIG. 5 is a table of parity bit addresses for coding rate 3/4 as reprinted from the ETSI DVB publication referenced above.

DETAILED DESCRIPTION

Figure 1:
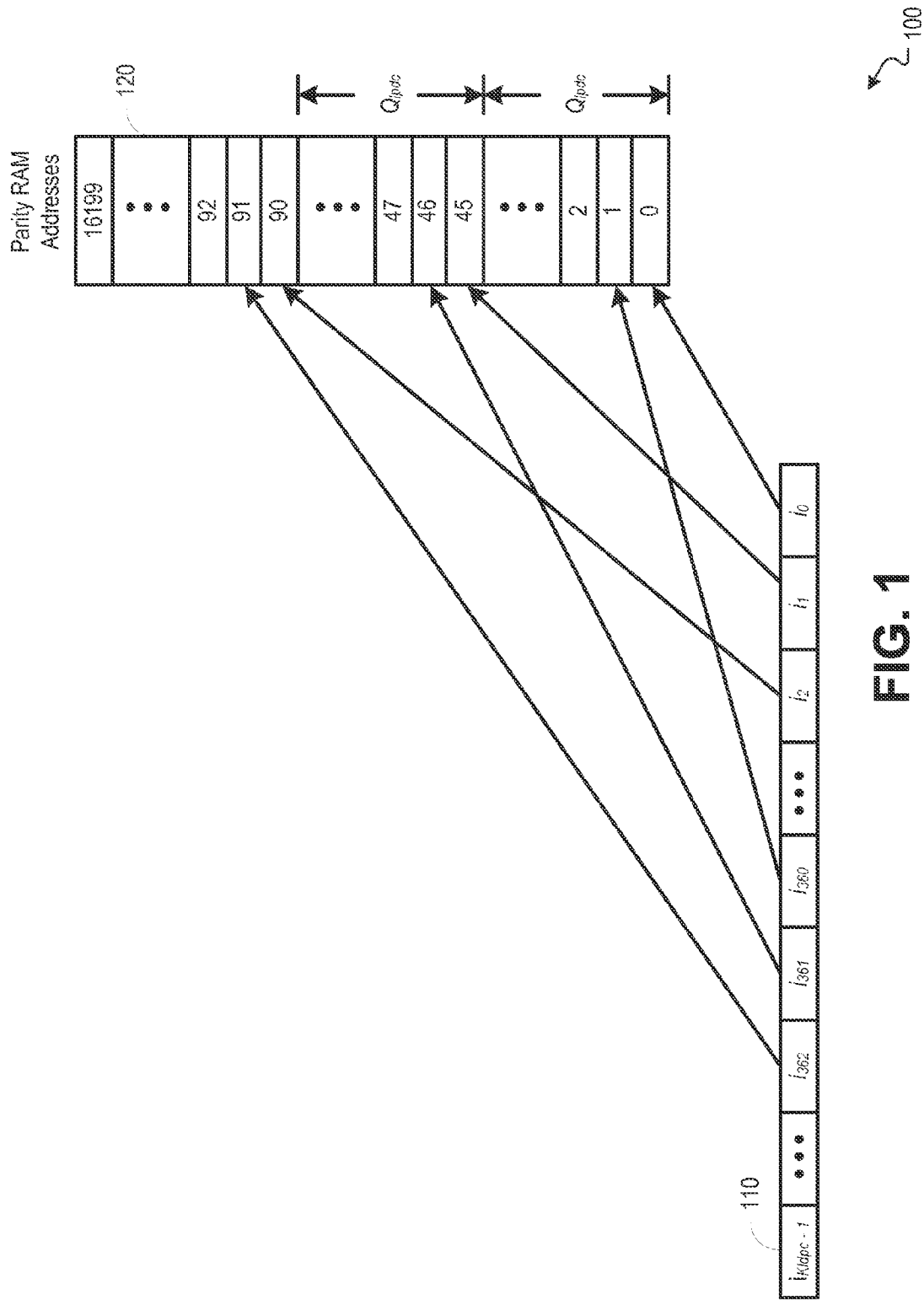
FIG. 1 is a block diagram illustrating an example accumulation of information bits at specific parity addresses.

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In some instances, well known methods and structures have not been described in detail so as not to unnecessarily obscure the embodiments.

Various terms used herein are defined in the ETSI DVB publication as used, for instance, for channel coding in a transmission system for digital television broadcasting via a hybrid fiber cable (HFC) cable network. This coding may use a FEC system based on low-density parity check (LDPC) codes concatenated with Bose Chaudhuri Hocquenghem (BCH). A few of these terms are defined below.

A FECFrame is a set $N_{LDPC}$ bits of one LDPC encoding operation in which $N_{LDPC}$ is the number of bits of a LDPC encoded block. As defined in the ETSI DVB publication, $N_{LDPC}$ equals 64,800 bits for a normal FECFrame and 16,200 bits for a short FECFrame.

The LDPC code rate equals $K_{LDPC}/N_{LDPC}$, where $K_{LDPC}$ is the number of bits of a LDPC uncoded block. The term $p_i$ represents LDPC parity bits where the number of parity bits equals $N_{LDPC} - K_{LDPC}$. $Q_{LDPC}$ is the code-rate dependent LDPC constant used in determining address location for parity bits. Table 1 provided below sets out the values for $N_{LDPC}$, $K_{LDPC}$, the number of parity bits ($p_i$), and $Q_{LDPC}$ for a normal FECFrame for each of various LDPC code rates disclosed in the ETSI DVB publication.

TABLE 1

| LDPC code rate | $N_{LDPC}$ | $K_{LDPC}$ | Parity bits ($p_i$) | $Q_{LDPC}$ |
| --- | --- | --- | --- | --- |
| 2/3 | 64,800 | 43,200 | 21,600 | 60 |
| 3/4 | 64,800 | 48,600 | 16,200 | 45 |
| 4/5 | 64,800 | 51,840 | 12,960 | 36 |
| 5/6 | 64,800 | 54,000 | 10,800 | 30 |
| 9/10 | 64,800 | 58,320 | 6,480 | 18 |

The symbol $\Lambda$ represents a LDPC codeword of a size equal to $N_{LDPC}$, and $\lambda_i$ represents a LDPC codeword bit. In addition, the symbol $\oplus$ represents an Exclusive OR (XOR) operation.

In some implementations of this disclosure, systems and methods can operate to generate LDPC codes using parallel accumulation (i.e., multiple simultaneous operations in parallel) as opposed to serial accumulation (i.e., one operation at a time).

As discussed above, a LDPC encoder can generate a frame of $N_{ldpc}$ bits in length comprising information ($i_0$ to $i_{Kldpc-1}$) and parity ($p_0$ to $p_{Nldpc-Kldpc-1}$). The information may be a codeword of a Bose-Chaudhuri-Hocquenghem (BHC) multiple error correction binary block code. The ETSI DVB standard specifies an LDPC encoder that can generate normal frames of 64,800 bits in length using code rates of 2/3, 3/4, 4/5, 5/6 and 9/10 and short frames of 16,200 bits using code rates of 1/2, 2/3, 3/4, 4/5 and 5/6. In some implementations of LDPC encoders, the ETSI DVB standard defines an FEC frame where $N_{ldpc}$=64,800 bits (i.e., frame size), $K_{ldpc}$=48,600 (i.e., number of information bits), $N_{ldpc}-K_{ldpc}$=16,200 (i.e., number of parity bits) with an LDPC code rate of 3/4. Examples provided below utilize such values; however, other code rates and values may be used.

A LDPC encoder can first initialize the parity bits $p_0$ to $p_{Nldpc-Kldpc-1}$ to zero. The LDPC encoder can generate parity bits $p_0$ to $p_{Nldpc-Kldpc-1}$ through accumulating specified information bits in parity bit address.

In some implementations of LDPC encoders, a table can be used to specify the parity addresses for accumulating specific information bits. For example, the ETSI DVB standard provides tables A.1 through A.5 for specifying parity addresses associated with information bits. In other implementations, different techniques can be used to specify the parity addresses for accumulating specific information bits.

By way of example, Table A.2 of the ETSI DVB standard specifies parity addresses for accumulating information bits for an LDPC code rate of 3/4 and $N_{ldpc}$=64800. Table A.2 of the ETSI DVB standard is represented herein as table 500 provided in FIG. 5.

The first row 510 of table 500 can be used to determine the parity bit addresses for accumulating the first information bit $i_0$. The first row 510 of table 500 contains address locations 0, 6385, 7901, 14611, 13389, 11200, 3252, 5243, 2504, 2722, 821 and 7374. The first information bit $i_0$, can be accumulated at each of the following parity addresses indicated below:

$$p_0 = p_0 \oplus i_0 \ p_{6385} = p_{6385} \oplus i_0$$

$$p_{7901} = p_{7901} \oplus i_0 \ p_{14611} = p_{14611} \oplus i_0$$

$$p_{13389} = p_{13389} \oplus i_0 \ p_{11200} = p_{11200} \oplus i_0$$

$$p_{3252} = p_{3252} \oplus i_0 \ p_{5243} = p_{5243} \oplus i_0$$

$$p_{2504} = p_{2504} \oplus i_0 \ p_{2722} = p_{2722} \oplus i_0$$

$$p_{821} = p_{821} \oplus i_0 \ p_{7374} = p_{7374} \oplus i_0$$

In some implementations, additional information bits comprising a block size of 360 information bits $i_m$, where (m=1, 2, . . . , 359) can accumulate at parity bit addresses specified by $(x+(m \bmod 360)*Q_{ldpc}) \bmod (N_{ldpc}-K_{ldpc})$ where x denotes the address of the parity bit accumulator corresponding to the first information bit $i_0$ and $Q_{ldpc}$ is the LDPC code rate dependent constant discussed above. In other implementations, a different information block size can be used. The accumulation of the $i_1$ information for an information block size of 360, a code rate of 3/4 and a $N_{ldpc}$=64800 can be shown below as:

$$p_{45} = p_{45} \oplus i_1 \ p_{6430} = p_{6430} \oplus i_1$$

$$p_{7946} = p_{7946} \oplus i_1 \ p_{14656} = p_{14656} \oplus i_1$$

$$p_{13434} = p_{13434} \oplus i_1 \ p_{11245} = p_{11245} \oplus i_1$$

$$p_{3297} = p_{3297} \oplus i_1 \ p_{5288} = p_{5288} \oplus i_1$$

$$p_{2549} = p_{2549} \oplus i_1 \ p_{2767} = p_{2767} \oplus i_1$$

$$p_{866} = p_{866} \oplus i_1 \ p_{7419} = p_{7419} \oplus i_1$$

In some implementations, such as the ETSI DVB standard, the second row 520 of table 500 can be used to determine the parity address for accumulating information bit $i_{360}$ and the formula $(x+(m \bmod 360)*Q_{ldpc}) \bmod (N_{ldpc}-K_{ldpc})$ can be used to accumulate information bits $i_{361}$ to $i_{719}$, where x denotes the address of the parity bit accumulator corresponding to the information bit $i_{360}$, m represents the information bit (m=361, 362, . . . , 719) and $Q_{ldpc}$ represents the same code rate constant value used earlier. The process of using a row from a table followed by a formula can be repeated until all $K_{ldpc}$ information bits are accumulated.

After all of the information bits have been accumulated the operation below can be performed sequentially on the parity bits as shown below:

$$p_i = p_i \oplus p_{i-1}, \text{ where}(i=1,2 \ldots N_{ldpc}-K_{ldpc-1})$$

FIG. 1 is a block diagram illustrating an example accumulation of information bits at specific parity addresses. In some implementations, the parity addresses can be specified in table 500 corresponding to table A.2 of the ETSI DVB specification. In other implementations, the parity addresses can be specified elsewhere.

A LDPC encoder can receive information bits 110 for accumulation in parity table 120. In some implementations, a first set of 360 information bits 110 ($i_0$ to $i_{359}$), can be accumulated at addresses in parity table 120 that can be offset by the constant factor of $Q_{ldpc}$.

Information block 110 can include $K_{ldpc}$ bits, ($i_0, i_1 \ldots i_{Kldpc-1}$), organized in groups of information bits, where each group can consist of a set of 360 information bits (M=INT($K_{ldpc}/360$)). Parity bit addresses for any information bit within the same group can be based on the same set of base parity addresses. For example, the g-th row in table 500 can specify the base parity address of a group. In some implementations, an information bit $i_k$, belongs to a group with an index number of g, where g can be found as:

$$g=INT(k/360)$$

In some implementations, parity bit addresses for information bits $i_j$, where (j=0, 1, 2 . . . 359), within a group g, can be offset by $j*Q_{ldpc}$. In the example presented previously, the parity address (PA) for accumulating information bits $i_0$ to $i_{359}$ can be determined by:

$$PAj=(0+j*Q_{ldp}) \bmod (N_{ldpc}-K_{ldpc}) \ PAj=(6385+j*Q_{ldp}) \bmod (N_{ldpc}-K_{ldpc})$$

$$PAj=(7901+j*Q_{ldp}) \bmod (N_{ldpc}-K_{ldpc}) \ PAj=(14611+j*Q_{ldp}) \bmod (N_{ldpc}-K_{ldpc})$$

$$PAj=(13389+j*Q_{ldp}) \bmod (N_{ldpc}-K_{ldpc}) \ PAj=(11200+j*Q_{ldp}) \bmod (N_{ldpc}-K_{ldpc})$$

$$PAj=(3252+j*Q_{ldp}) \bmod (N_{ldpc}-K_{ldpc}) \ PAj=(5243+j*Q_{ldp}) \bmod (N_{ldpc}-K_{ldpc})$$

$$PAj=(2504+j*Q_{ldp}) \bmod (N_{ldpc}-K_{ldpc}) \ PAj=(2722+j*Q_{ldp}) \bmod (N_{ldpc}-K_{ldpc})$$

$$PAj=(821+j*Q_{ldp}) \bmod (N_{ldpc}-K_{ldpc}) \ PAj=(7374+j*Q_{ldp}) \bmod (N_{ldpc}-K_{ldpc})$$

The above equations can be represented by $PAj=(BPA_g+j*Q_{ldp}) \bmod (N_{ldpc}-K_{ldpc})$ where $BPA_g$ can represent the base parity address corresponding to a group.

In some implementations, it can be advantageous to accumulate a consecutive set of information bits (e.g., $i_0$ to $i_{359}$) through performing a vector read, exclusive or (XOR) and write operation. However, referring to FIG. 1, the parity addresses of 0, 45, 90, used to accumulate consecutive information bits are not contiguous.

To facilitate parallel accumulation of information bits through vector operations a virtual to physical parity address mapping can be used. In some implementations, a virtual parity address (VPA) associated with a physical parity address for accumulating information bits can be determined by:

$$VPAj=(INT(BPA_g/Q_{ldpc})+j) \bmod 360+(BPA_g \bmod Q_{ldpc})*360$$

$BPA_g$ can represent the base physical address for a group g. The virtual parity addresses for the information bits within a group can increment by 1. Additionally, a whole group of 360 information bits can be accumulated through a read, exclusive or and write operation. Virtual parity addresses when incremented wrap within the same virtual parity group. For example, VPA=359+1=0.

FIG. 2 is a table illustrating an example virtual to physical parity address map operable to accumulate a set of contiguous information bits. The virtual to physical parity address map 200 contains virtual parity addresses 210 that increment by one and map to corresponding physical parity addresses 220. In some implementations, the virtual to physical parity address map 200 illustrated in FIG. 2 accumulates information bits as specified in table 500. In other implementations, the virtual to physical address map 200 can be different.

Figure 3:
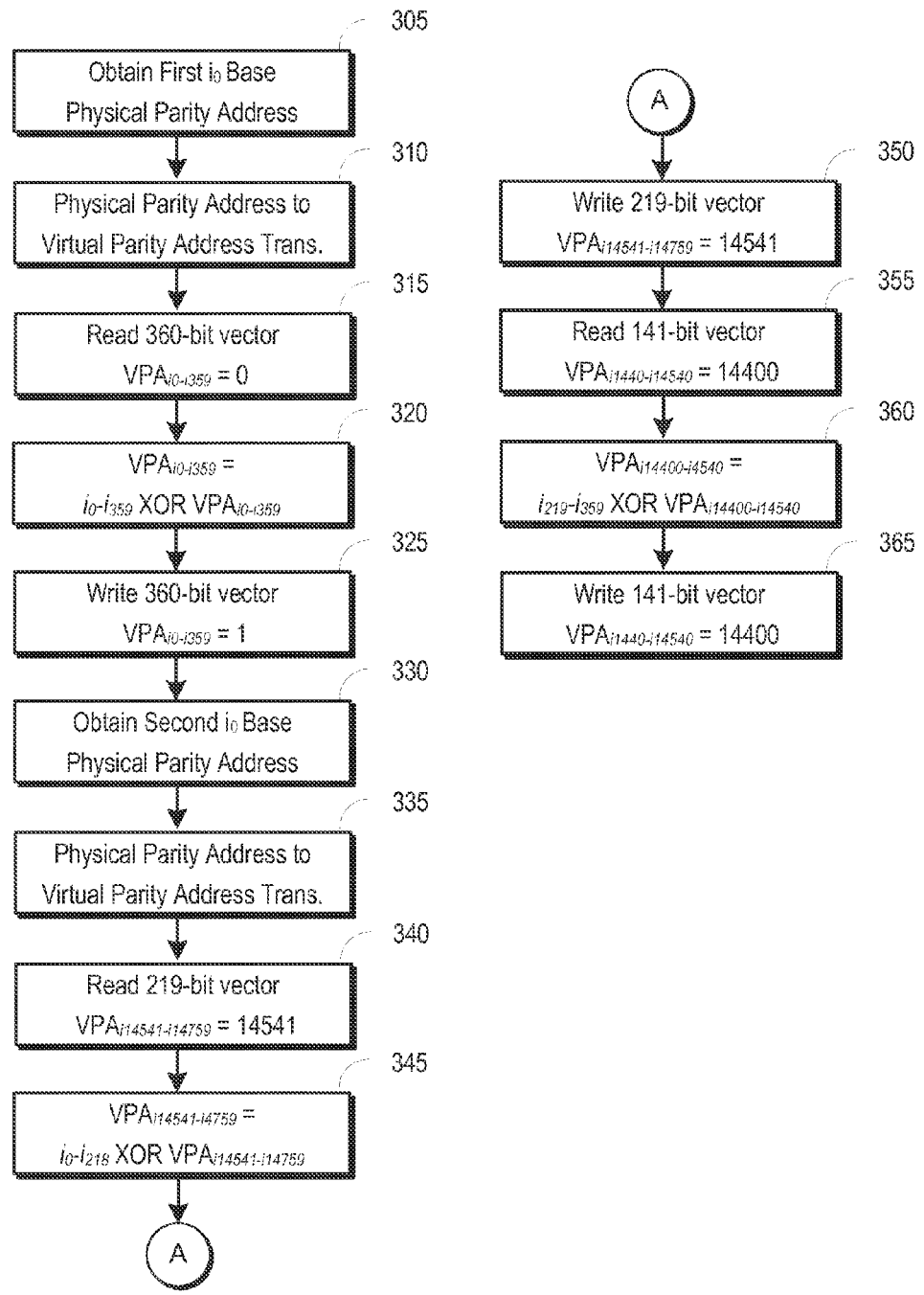
FIG. 3 is a flow chart illustrating an example process that can be used by a LDPC encoder to generate parity bits through parallel accumulation.

FIG. 3 is a flow chart illustrating an example process that can be used by a LDPC encoder to generate parity bits through parallel accumulation.

The process 300 starts at stage 305 where the first physical base parity address for accumulating the $i_0$ information bit can be obtained. In some implementations, the first entry in the first row of table 500 can be used to obtain the $i_0$ first parity address of 0. In other implementations, the base parity address can be determined differently. The parity address can be obtained, for example, by the LDPC encoder.

At stage 310, the physical base parity address can be translated to a virtual base parity address. In some implementations, the virtual to physical parity address map (e.g., virtual to physical parity address map 200 of FIG. 2) can be used to perform the translation. A physical base parity address of 0 can translate to virtual base parity address of 0 belonging to virtual parity address group 0. The physical parity to virtual address translation can be performed, for example, by the LDPC encoder.

At stage 315, a 360-bit vector can be read at the virtual parity address. In some implementations, the 360-bit vector will contain information bits $i_0$ to $i_{359}$ enabling the accumulation of 360 information bits. The 360-bit vector can be read, for example, by the LDPC encoder.

At stage 320, an exclusive or (XOR) can be performed between a vector containing information elements $i_0$ to $i_{359}$ and the 360 parity bits accessed at the virtual parity address. The exclusive or (XOR) operation can be performed, for example by the LDPC encoder.

At stage 325, the 360-bit vector result of the exclusive or (XOR) operation can be written to the virtual parity address. The 360-bit vector can be written, for example, by the LDPC encoder.

At stage 330, the second physical parity address for accumulating the $i_0$ information bit can be obtained. In some implementations, the second entry in the first row 510 of table 500 can be used to obtain the second $i_0$ parity address of 6385. In other implementations, the base parity address can be determined differently. The parity address can be obtained, for example, by the LDPC encoder.

At stage 335, the physical base parity address can be translated to a virtual base parity address. In some implementations, the virtual to physical parity address map (e.g., virtual to physical parity address map 200 of FIG. 2) can be used to perform the translation. A physical base parity address of 6385 can translate to virtual base parity address of 14541 belonging to virtual parity address group 40. The physical parity to virtual address translation can be performed, for example, by the LDPC encoder.

At stage 340, a 219-bit vector can be read at the virtual parity address. Since the virtual parity address begins in the middle of a virtual parity address group, two operations can be used to accumulate 360 information bits. The 219-bit vector starts at a virtual parity address of 14541 and ends at 14759, the wrap point for VPA group 40. The 219-bit vector can be read, for example, by the LDPC encoder.

At stage 345, an exclusive or (XOR) can be performed between a vector containing information elements $i_0$ to $i_{218}$ and the 219 parity bits accessed at the virtual parity address. The exclusive or (XOR) operation can be performed, for example by the LDPC encoder.

At stage 350, the 219-bit vector result of the exclusive or (XOR) operation can be written to the virtual parity address. The 360-bit vector can be written, for example, by the LDPC encoder.

At stage 355, a 141-bit vector can be read at a virtual parity address of 14400. A virtual parity address of 14400 can represent the starting address of VPA group 40. The 141-bit vector can be read, for example, by the LDPC encoder.

At stage 360, an exclusive or (XOR) can be performed between a vector containing information elements $i_{219}$ to $i_{359}$ and the 141 parity bits accessed at the virtual parity address. The exclusive or operation can be performed, for example by the LDPC encoder.

At stage 350, the 141-bit vector result of the exclusive or (XOR) operation can be written to the virtual parity address. The 141-bit vector can be written, for example, by the LDPC encoder.

Process 300 can continue until all $K_{ldpc}$ information bits are accumulated.

Figure 4:
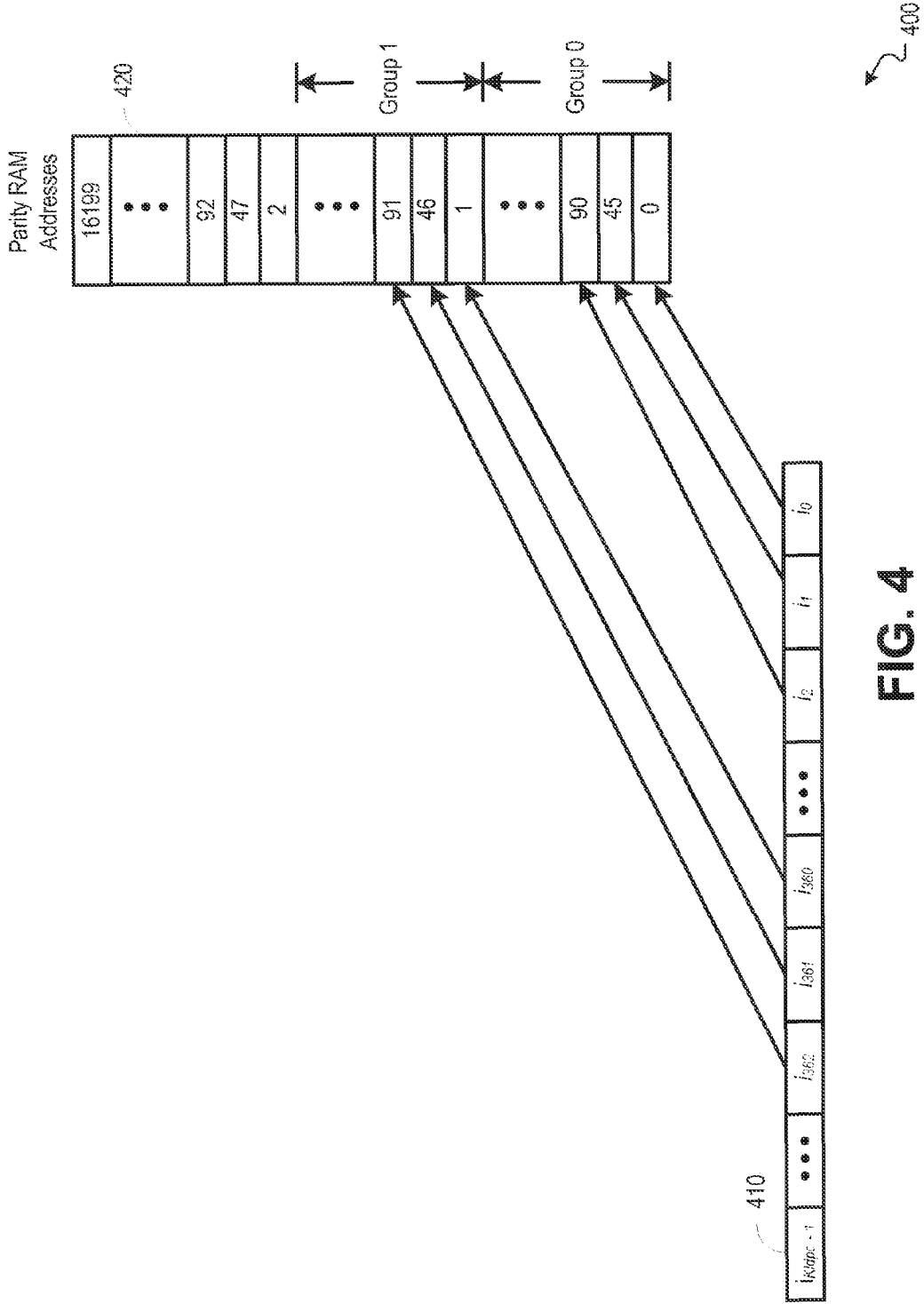
FIG. 4 is a block diagram illustrating an example of parallel accumulation of information bits.

FIG. 4 is a block diagram illustrating an example of parallel accumulation of information bits. An LDPC encoder can receive information bits 410 for accumulation in parity table 420. In some implementations, a first set of 360 information bits ($i_0$ to $i_{359}$) and a second set of information bits ($i_{360}$ to $i_{719}$), can be accumulated at addresses in parity table 420 offset by a constant factor of $Q_{ldpc}$. The contents of the parity table 420 in FIG. 4 (i.e., 0, 45, 90, . . . ) represent physical parity addresses.

In some implementations, parity table 420 can be implemented with a 360-bit memory. In other implementations, for example, a 36-bit memory can be used where ten operations are performed.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter described in this specification have been described. Other embodiments are within the scope of the following claims. For example, the actions recited in the claims can be performed in a different order and still achieve desirable results, unless expressly noted otherwise. As one example, the processes depicted in the accompanying figures do not necessarily require the particular order shown, or sequential order, to achieve desirable results. In some implementations, multi-tasking and parallel processing may be advantageous.

I claim:

1. A method for accumulating a set of parity bits for an encoding operation, comprising the steps of:
    establishing, in an encoder, a virtual address for each of a set of pre-defined addresses of parity bits in memory, wherein the pre-defined addresses are non-consecutive addresses in random access memory (RAM);
    generating, in the encoder, a multi-bit vector of parity bits by reading parity bits from consecutive ones of the virtual addresses;
    performing an exclusive or (XOR) operation between a multi-bit vector containing information bits and the multi-bit vector of parity bits in the encoder; and
    storing results of the XOR operation as a set of parity bits.

2. The method according to claim 1, wherein the storing step includes writing the results of the XOR operation to the consecutive addresses of the virtual addresses.

3. The method according to claim 1, further comprising the step of mapping values of the parity bits stored in the virtual addresses to the pre-defined addresses after said storing step.

4. The method according to claim 1, further comprising the step of mapping each of the pre-defined addresses to a corresponding one of the virtual addresses and initializing the parity bits with a pre-determined value before said generating step.

5. The method according to claim 1, wherein the encoding operation is a low-density parity check (LDPC) encoding operation.

6. The method according to claim 1, wherein each of the multi-bit vector containing information bits and the multi-bit vector of parity bits includes up to 360 binary bits.

7. The method according to claim 1, wherein the XOR operation is accomplished simultaneously in parallel operations for all bits in the multi-bit vectors.

8. A forward error correction (FEC) device comprising an encoder, the encoder comprising at least one processor communicatively coupled to a memory device, the encoder configured to:
    perform an exclusive or (XOR) operation between a multi-bit vector containing information bits and a multi-bit vector of parity bits;
    store results of the XOR operation as a set of parity bits in the memory device;
    establish a virtual address for each of a set of pre-defined addresses of parity bits in the memory device, wherein the pre-defined addresses are non-consecutive addresses in random access memory (RAM); and
    generate the multi-bit vector of parity bits by reading parity bits from consecutive ones of the virtual addresses.

9. The FEC device according to claim 8, wherein the encoder is configured to perform the XOR operation simultaneously in parallel operations for all bits in the multi-bit vectors.

10. The FEC device according to claim 8, wherein the encoder is a low-density parity check (LDPC) encoder.

11. The FEC device according to claim 8, wherein each of the multi-bit vector containing information bits and the multi-bit vector of parity bits includes up to 360 binary bits.

12. The FEC device according to claim 8, wherein the encoder is configured to store the results of the XOR operation by writing the results of the XOR operation to the consecutive addresses of the virtual addresses.

13. The FEC device according to claim 8, wherein the encoder is configured to map values of the parity bits stored in the virtual addresses and resulting from the XOR operation to the pre-defined addresses.

14. The FEC device according to claim 8, wherein the encoder is configured to map each of the pre-defined addresses to a corresponding one of the virtual addresses and initialize the parity bits with a pre-determined value before performing the XOR operation.

* * * * *